United States Patent

Voronin et al.

(10) Patent No.: US 10,237,916 B2
(45) Date of Patent: Mar. 19, 2019

(54) SYSTEMS AND METHODS FOR ESC TEMPERATURE CONTROL

(71) Applicant: Tokyo Electron Limited, Tokyo (JP)

(72) Inventors: Sergey A. Voronin, Delmar, NY (US); Alok Ranjan, Mechanicville, NY (US)

(73) Assignee: Tokyo Electron Limited, Tokyo (JP)

(*) Notice: Subject to any disclaimer, the term of this patent is extended or adjusted under 35 U.S.C. 154(b) by 646 days.

(21) Appl. No.: 14/871,518

(22) Filed: Sep. 30, 2015

(65) Prior Publication Data

US 2017/0094719 A1    Mar. 30, 2017

(51) Int. Cl.
*H05B 1/02* (2006.01)
*H01L 21/67* (2006.01)
*H01J 37/32* (2006.01)

(52) U.S. Cl.
CPC ...... *H05B 1/0233* (2013.01); *H01J 37/32009* (2013.01); *H01J 37/32082* (2013.01); *H01J 37/32724* (2013.01); *H01L 21/67103* (2013.01); *H01L 21/67248* (2013.01)

(58) Field of Classification Search
CPC ............. H05B 1/0233; H01J 32/32009; H01J 37/32082; H01J 37/32724; H01J 37/32091; H01J 2337/3342; H01J 2337/3343; H01J 2337/334; H01J 2337/3323; H01J 2337/3321; H01J 2337/332; H01J 2337/327; H01L 21/67103; H01L 21/67248; H01L 21/6831; H01L 21/6833; H01L 21/3065; H01L 21/67109; H01L 21/32136; H01L 21/3118; H01L 21/31116; H01L 21/28556; H01L 21/0262; H01L 21/02274; C23C 16/4586
See application file for complete search history.

(56) References Cited

U.S. PATENT DOCUMENTS 4,205,782 A    6/1980   Cannella
4,668,908 A    5/1987   Aoki et al.
4,845,342 A    6/1989   Chen
(Continued)

FOREIGN PATENT DOCUMENTS

CN    102668058 A     9/2012
JP    2015-520504 A   7/2015
TW    M370189 U1     12/2009

OTHER PUBLICATIONS

Combined Office Action and Search Report dated May 16, 2018 in Taiwanese Patent Application No. 105131181 (with English language translation) citing references AO—AQ therein, 13 pages.

*Primary Examiner* — Shawntina Fuqua
(74) *Attorney, Agent, or Firm* — Oblon, McClelland, Maier & Neustadt, L.L.P.

(57) ABSTRACT

This disclosure relates to a temperature control system that may be used in a plasma processing system that treats microelectronic substrates using plasma. The temperature control system may include a heating array disposed adjacent to the microelectronic substrate and that may selectively generate heat at different portions of the microelectronic substrate. The heating array may include heating modules that selectively generate heat depending upon a breakover voltage of a Silicon Diode for Alternating Current (SIDAC). The amount of heat generated heat may depend upon the resistance of the heating module and the duty cycle of the variable voltage signal.

20 Claims, 6 Drawing Sheets

(56) References Cited

U.S. PATENT DOCUMENTS

| | | |
|---|---|---|
| 8,637,794 B2 * | 1/2014 | Singh .................... C23C 14/541 219/483 |
| 8,680,441 B2 | 3/2014 | Singh |
| 8,809,747 B2 | 8/2014 | Pease et al. |
| 2014/0047705 A1 | 2/2014 | Singh et al. |
| 2015/0043123 A1 | 2/2015 | Cox |

* cited by examiner

SYSTEMS AND METHODS FOR ESC TEMPERATURE CONTROL

FIELD OF THE DISCLOSURE

This invention relates to semiconductor processing technology, and more particularly, to systems and methods for controlling temperature of a microelectronic substrate during plasma treatments.

BACKGROUND

The geometries of microelectronic features continue to scale to smaller sizes and increase in complexity. Accordingly, the processing techniques used to manufacture microelectronic devices may need to become more precise to create smaller features on microelectronic substrates. Further, the size of microelectronic substrates may also increase over time. Plasma processing may be used to form or etch features on the microelectronic substrate. Plasma treatments may be influenced by many different process conditions, but substrate temperature may play an important role when forming features, in a uniform manner, across the microelectronic substrate. Although existing plasma systems may use heating elements within substrate chucks, they may lack the ability to finely control temperature across microelectronic substrates to form smaller features in a cost effective manner. Accordingly, improving temperature resolution for substrate chucks in a cost effective manner may be desirable.

SUMMARY

This disclosure relates to systems and methods for controlling temperature during treatments of microelectronic substrates used to manufacture microelectronic devices. A wide variety of semiconductor processing techniques may be influenced by the temperature of the microelectronic substrate. The processing techniques may include, but are not limited to, etching, deposition, curing and the like. Temperature control may include applying energy (e.g., heat) to portions of the microelectronic substrate to achieve a steady-state or a temperature profile across the surface of the microelectronic substrate. However, improving the temperature resolution over smaller portions of the microelectronic substrate may be problematic, in that scaling existing systems to include more power sources and heating elements that may be in closer proximity to each other may increase cost and system complexity. The increased cost may arise from adding additional power sources and the hardware/software infrastructure to manage the additional power sources in a cooperative manner. Disclosed herein are systems and methods that may minimize tool cost by using heating elements that may be individually controlled using a single power source.

In one embodiment, the system may include a process chamber that may treat microelectronic substrates with plasma. The process chamber may be in electrical or fluid communication with several system components that may deliver gases, energy, or vacuum that may be used to generate plasma. Additionally, the process chamber may include a substrate holder that may be used to heat the microelectronic substrate during plasma processing. The substrate holder may include a supporting surface that may secure the microelectronic substrate using an electrostatic coupling component. In one specific instance, the substrate holder may also include a heating array that may be used to selectively heat different portions of the microelectronic substrate. The heating array may include heating modules that may be arranged across the substrate holder that may be used to selectively heat the microelectronic substrate. The heating modules may be arranged in parallel, such that a single power source can apply a voltage to all of the heating modules. The heating array may receive a power modulation signal or variable voltage signal that may be selectively applied to the load elements (e.g., resistors) based, at least in part, on the configuration of the corresponding switch element (e.g., thyristor or bi-directional diode). In this instance, the switch elements may be configured with different trigger voltages or breakover voltages that may allow current to reach the corresponding load element under certain conditions. The current may drive the heat generation, via the resistor, that is transferred to the microelectronic substrate. A signal generator or power source may vary the voltage and duty cycle of the pulse modulated signal to selectively breakover switches. For example, portions of the heating array may selectively receive current at specific heating modules based, at least in part, on the switch element breakover design and the design of the variable voltage signal. In this way, a person of ordinary skill in the art may generate a pulse modulated signal that targets designated heating modules to maintain a desired temperature profile across the microelectronic substrate.

In one embodiment, the switch elements may be assigned to different groups that may allow different portions of the substrate holder to be heated. For example, the heating array may have a first group of heating modules comprising the same or similar breakover voltages and a second group of heating modules may have different breakover voltages from the first group. The substrate may selectively heat the microelectronic substrate using the first group without using the second group of heating modules. However, the variable voltage signal may shift, in such a way, that heating may be done by using the first and second group at the same time. For example, the first group may have breakover voltages within a first range, such that the first group may be used for heating using a first power modulation signal provided by the signal generator. The first power modulation signal may trigger the breakover of the switch elements causing current to flow through the load elements that may generate heat that may be transferred to the substrate or plasma. A second power modulation signal may be configured to trigger the switch breakover for the first group and a second group of heating modules. In another embodiment, the second power modulation signal may trigger switch breakover for the second group and not the first group of switching elements. In this way, the power signal modulation signals and the switch elements may be optimized to selectively heat the substrate based, at least in part, on the location of the heating modules with respect to the substrate. Hence, the heating module placement, power modulation signals, switching element breakover voltages, and load element resistances may be optimized to achieve different temperature profiles that may be optimized to alter plasma etching/deposition performance on the microelectronic substrate.

In another embodiment, a heating array may be disposed subjacent to the microelectronic substrate support surface and may include a parallel arrangement heating elements. The heating elements may be arranged in parallel geometrically, electrically or both. The heating array may be electrically coupled to a single power signal generator that may provide a varying voltage signal that may be used to selectively apply current to different portions of the heating array. Selectively applying current to portions of the heating array may enable different substrate temperature profiles during plasma treatments. A person of ordinary skill in the art may optimize the heating array design and the voltage signal modulations to obtain different temperature profiles to address process non-uniformity across the microelectronic substrate. The heating array may be disposed above or below an electrostatic coupling component that may be used to secure (e.g., magnetically) the microelectronic substrate to the support surface.

In this embodiment, the heating array may include heating elements that may include a load element (e.g., resistor) and a bi-directional current component (e.g., thyristor) to regulate when current may be applied to the load element. The bi-directional current components may be designed with specific breakover voltages that may switch between a passive state that may prevent current from flowing through the bi-directional current component to the load element. When the breakover voltage, applied by the signal generator, exceeds a threshold amount, the bi-directional component may transition to an active state and allow current flow through to the respective load element. In one specific embodiment, the bi-directional current component may include a silicon diode for alternating current (SIDAC) that may transition between the aforementioned passive state and active state.

In another specific embodiment, the bi-directional current components may comprise different breakover voltages that may allow a person of ordinary skill in the art to direct current flow to a specific element or to a subset of load elements. The amount of heating may be related to the current magnitude and the resistance of the load element(s). In one instance, the load elements may have the same or similar resistance values and may the same or similar amount of heat. However, in other embodiments, the load elements may have different resistance values and may generate different amounts of heat, even if the same or similar current or voltage may be applied to the load elements. In this instance, the heating array may include two or more groups of heating elements that may have common breakover voltages that may allow the selective application of current to their respective load elements. Also, the groups of heating elements may have different resistances, such that portions of the groups may generate differing amounts of heat using the same applied voltage. Over time, the selective current application may generate a temperature profile across the microelectronic substrate.

In certain embodiments, the heating array may include a temperature feedback system that may optimize the power modulation signal to maintain certain temperature conditions across the microelectronic substrate. For example, this may include higher temperatures at the edge of the microelectronic substrate than at the center. In other embodiments, the temperature profile may have a center-high and edge-low temperature profile.

One method for obtaining a temperature profile across the microelectronic substrate may include receiving the microelectronic substrate on a substrate holder of a plasma processing chamber. The substrate holder may also include an holder that may be used to magnetically secure microelectronic substrate to substrate holder. In this embodiment, the substrate holder may include an arrangement of heating elements that may include a load element and a switching element placed in series with each other. The heating elements may form a circuit in which the heating elements are in parallel with each other, such that each heating element may receive the same voltage at then respective switching elements. The heating elements may be used to form a temperature profile across the microelectronic substrate, by selectively heating portions of the substrate holder to counter heat loss/gain during plasma processing. In this instance, a controller for the plasma system may apply a variable voltage signal to the parallel arrangement of the heating elements. A first portion of the switch elements may exceed their breakover voltages and allow current to flow through to their respective load elements. Accordingly, the load elements (e.g., resistors) may increase in temperature based, at least in part, on the amount of current, duty cycle and the resistance magnitude of the load elements. The heating may form a first temperature profile along the substrate chuck. In other embodiments, the first temperature profile may transition to a second temperature profile based on changes in the variable voltage signal that may increase or decrease the amount of heating elements that may be in active state. In other embodiments, the second temperature profile may be enabled by using the same heating elements, but varying the amount of current that may be provided to the load elements. For example, the breakover voltage may be maintained for the second voltage variable, but the magnitude of the signal may be lower or higher to decrease or increase the amount of heat generated at the load elements.

This summary is intended to provide an overview of the disclosure and is not intended to limit the scope of the claims to embodiments described above. The embodiments described in the summary are merely for illustrative purposes.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention. Additionally, the left most digit(s) of a reference number identifies the drawing in which the reference number first appears.

DETAILED DESCRIPTION

Figure 1:
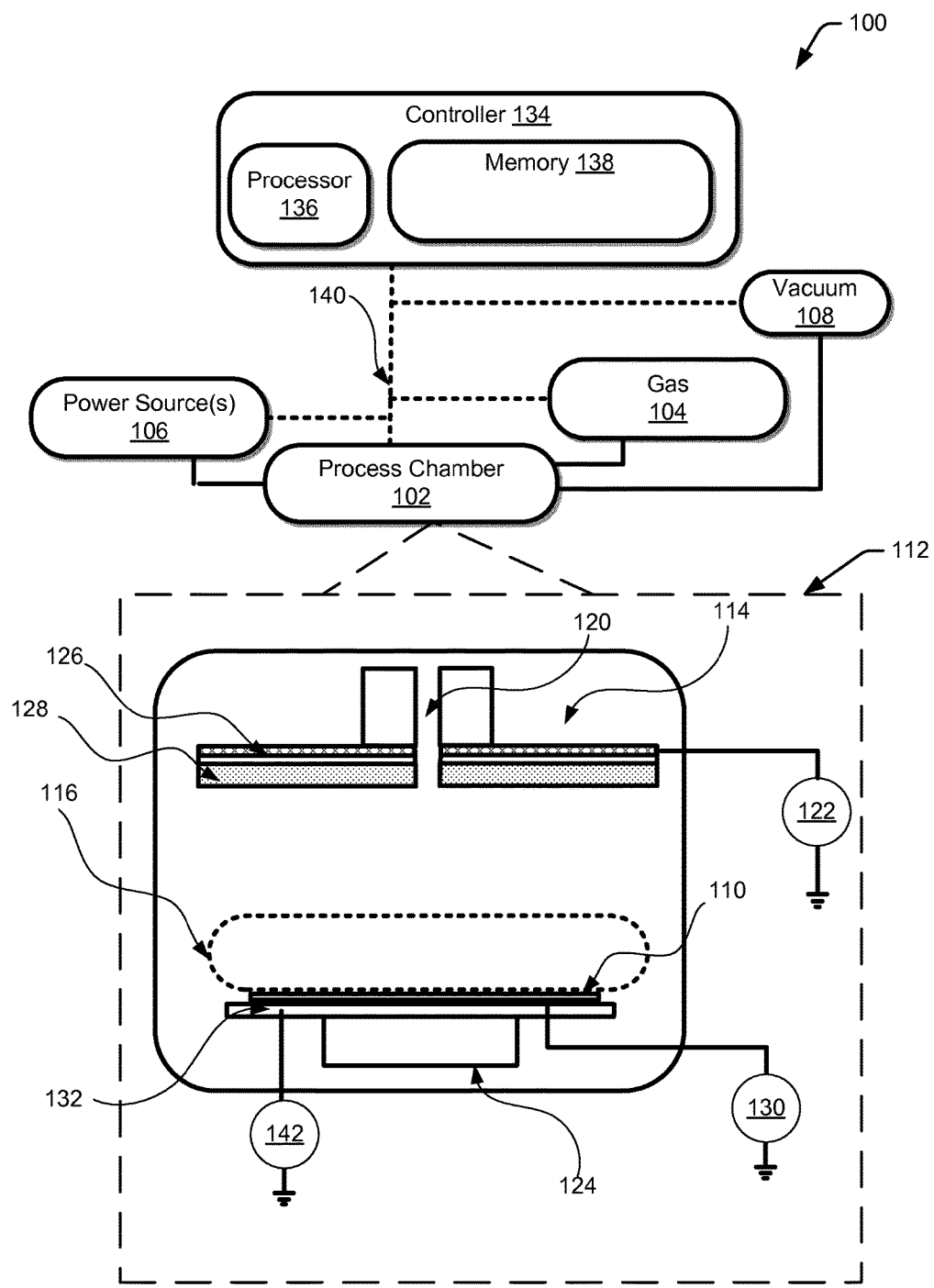
FIG. 1 is an illustration of a representative embodiment of a plasma processing system that shows a schematic cross-sectional illustration of a plasma chamber that may include a heating array disposed in a substrate holder according to at least one embodiment.

The following Detailed Description refers to accompanying drawings to illustrate exemplary embodiments consistent with the present disclosure. References in the Detailed Description to "one embodiment," "an embodiment," "an exemplary embodiment," etc., indicate that the exemplary embodiment described can include a particular feature, structure, or characteristic, but every exemplary embodiment does not necessarily include the particular feature, structure, or characteristic. Moreover, such phrases are not necessarily referring to the same embodiment. Further, when a particular feature, structure, or characteristic is described in connection with an embodiment, it is within the knowledge of those skilled in the relevant art(s) to affect such feature, structure, or characteristic in connection with other exemplary embodiments whether or not explicitly described.

"Substrate" or "Microelectronic substrate" as used herein generically refers to the object being processed in accordance with the embodiments described herein. The microelectronic substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The exemplary embodiments described herein are provided for illustrative purposes, and are not limiting. Other embodiments are possible, and modifications can be made to exemplary embodiments within the scope of the present disclosure. Therefore, the Detailed Description is not meant to limit the present disclosure. Rather, the scope of the present disclosure is defined only in accordance with the following claims and their equivalents.

The following Detailed Description of the exemplary embodiments will so fully reveal the general nature of the present disclosure that others can, by applying knowledge of those skilled in the relevant art(s), readily modify and/or adapt for various applications such exemplary embodiments, without undue experimentation, without departing from the scope of the present disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not limitation, such that the terminology or phraseology of the present specification is to be interpreted by those skilled in relevant art(s) in light of the teachings herein.

FIG. 1 depicts a plasma processing system 100 for treating substrates using plasma (not shown) that may be generated in a plasma chamber 102. Plasma may be generated by applying electromagnetic energy (e.g., power sources 106) to a process gas(es) that is provided by a gas delivery system 104 to the plasma chamber 102. The gas delivery system 104 may include mass flow controllers, check valves, and the like to be used control gas mixture distribution. A vacuum system 108 in fluid communication with the plasma chamber 102 may also maintain a sub-atmospheric pressure during plasma generation. The vacuum system 108 may include one or more pumps and control systems (e.g., $N_2$ ballast system, butter-fly valve system) to control the pressure within the plasma chamber 102.

Plasma generation may be done by applying electromagnetic energy to an electrically neutral gas to cause electrons to be released from a gas molecules that are positively charged (e.g., ion) as result of the lost electron. The ions may be characterized as a molecule or atom where the total number of electrons are not equal to the total number of protons resulting in a positive charge. Molecular or atomic radicals (e.g., molecules or atoms with at least one unpaired electron) may also be generated from the electrically neutral gas. Generally, the radicals may have a neutral, positive, or negative charge and may have high chemical reactivity relative to the ions. Over time, the electromagnetic energy and the increasing electron collisions within the gas mixture may increase the density of ionized molecules and radicals within the gas mixture that may be used to treat the substrate 110.

The plasma chamber system 100 may alter certain process conditions to influence the amount of flow of ions and/or radicals towards the substrate, such that the ionized molecules (not shown) may be influenced by potential differences within the plasma chamber 102. For example, the potential differences within the plasma chamber 102 may direct the ionized molecules (or atoms, or radicals) towards a substrate 110. The ions and radicals may interact with the substrate 110 or treat the substrate through deposition or passivation or that may remove a portion of the substrate.

In FIG. 1, the plasma chamber 102 cross section illustration 112 illustrates one embodiment of the plasma chamber 102 that includes a power source assembly 114 that enables the transmission of electromagnetic energy (e.g., microwave energy, RF energy) and the gas mixture (not shown) into the region proximate to the substrate 110. The gas mixture may be introduced into the plasma processing region 116 that is proximate to the substrate holder 124, along the gas pathway 120 through the center of the power source assembly 114. In other embodiments, the gas mixture may be introduced from other locations within the plasma chamber 102. The plasma processing region 116 may also receive energy from a first energy source 122 to generate plasma that may be used to treat a substrate 110 disposed on the substrate holder 124. The electromagnetic energy may include electromagnetic energy (e.g., microwave energy @>300 MHz and/or radio-frequency (RF) energy @<300 MHz) that may transmitted, in some way, from the power source 106 to the power source assembly 114. In the FIG. 1 embodiment, the power source assembly 114 may include a microwave waveguide 126 and the dielectric component 128 may be disposed around the gas pathway 118.

The gas mixture in the plasma processing region 116 may also receive electromagnetic energy from a second source (e.g., bias power source 130) that may bias the substrate holder 124 and influence the plasma characteristics proximate to the substrate 110. In some embodiments, the bias power source 130 and the first power source 122 may be operated in unison or alone to generate plasma within the plasma processing region 116. In addition to electromagnetic energy, plasma characteristics may also be influenced by temperature, particularly close to the substrate 110. The temperature profile across the substrate 110 may be influenced by heat loss to the chamber walls or heat gain from the plasma. These heat sources and/or heat sinks may impact processing temperature at the substrate 110 that may cause process non-uniformities (e.g., etch rate, deposition rate, etc.) across the substrate 110. One approach to control the temperature profile may be to include a heating array 132 that may include heat sources (not shown) distributed underneath the substrate 110. The heating array 132 may selectively apply heat to the substrate 110 to alter the temperature profile to reduce process non-uniformities. The heat sources (not shown) may generate heat when a signal generator 142 applies an electrical signal to one or more portions of the heating array 132. The biasing of the substrate holder 124, the power assembly 114 and the heating array 132 may be implemented by using a controller 134 that may coordinate the process sequencing that generates plasma within the plasma processing region 116.

The controller 132 may use a computer processor 136 and memory 138 to execute computer-readable instructions that may be provided over an electrical communication network 140 to control the plasma processing system 100 components (e.g., power sources 106, gas delivery 104, etc.). The one or more computer processors 136 may include, without limitation: a central processing unit (CPU), a digital signal processor (DSP), a reduced instruction set computer (RISC), a complex instruction set computer (CISC), a microprocessor, a microcontroller, a field programmable gate array (FPGA), or any combination thereof. The memory 136 may include one or more computer-readable storage media ("CRSM"). In some embodiments, the one or more memories may include non-transitory media such as random access memory ("RAM"), flash RAM, solid state media, and so forth. Broadly, the controller 134 may control the sequencing of processing events that enable plasma generation or to transition between different types of plasma that may be exposed to the substrate 110.

The plasma processing system 100 may be used to implement several different types of plasma that may be used to etch patterns into the substrate 110, deposit films onto the substrate 110 or to dope the substrate 110. As the size and complexity of electronic devices increases, the need for higher precision processing uniformly distributed across the substrate 110 has increased. In some plasma processing embodiments, the temperature profile across the substrate 110 may have strong impact on etch rates, deposition rates, or doping concentrations across the substrate 110. For example, having different etch rates at the center and edge of the substrate 110 may cause different amounts of the substrate 110 to be removed. This uneven removal may impact feature size or geometry, such that devices at different locations on the substrate 110 may operate differently from one another or some portions of the devices may not operate properly, if at all. A person of ordinary skill in the art may use the controller 134 to select regions of the substrate 110 that may be heated by the heating array 132 to minimize the plasma process non-uniformities across the substrate 110. The controller 134 may operate the heating array 132 in a closed loop or open loop manner.

Figure 2:
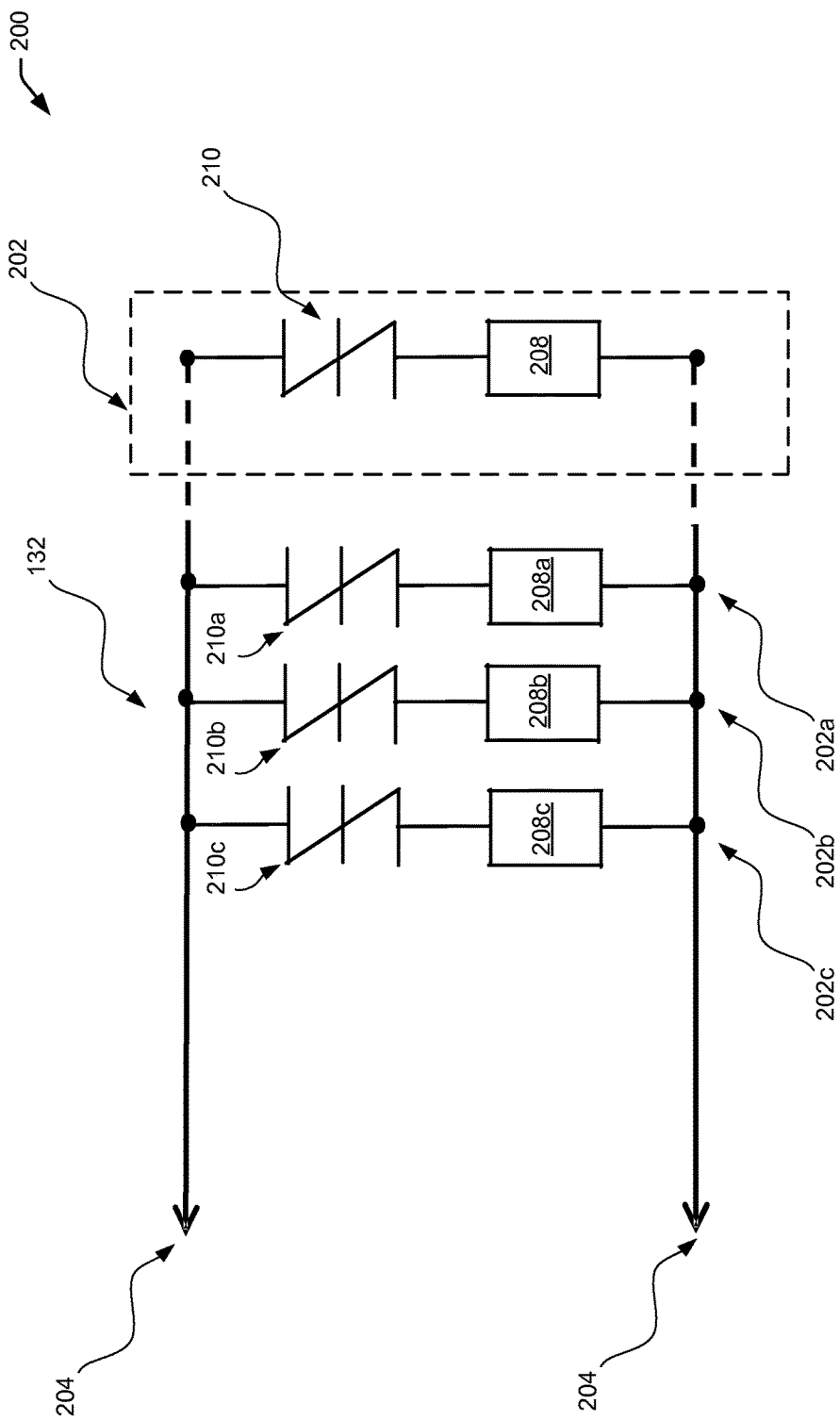
FIG. 2 is an illustration of a circuit diagram of the heating array according to at least one embodiment.

FIG. 2 is an illustration of a circuit diagram 200 of one embodiment of the heating array 132 that may be disposed in the substrate holder 124. The heating array 132 may include a plurality of heating modules 202 that may be arranged in parallel with each other, such that any input signal or applied voltage to a common terminal 204 may be concurrently applied to the plurality of heating modules 202. Although FIG. 2 illustrates four heating modules 202, 202a, 202b, 202c other embodiments may include up to nth number of heating modules 202. The heating module(s) 202 may be used to generate heat that may be transferred to the substrate holder 124 and/or the substrate 110.

The heating modules 202, 202a, 202b, 202c may include switch elements 210, 210a, 210b, 210c and may be disposed in series with their respective load element 208, 208a, 208b, 208c. The heating module 202 may be regulated between active state (e.g., generating heat) or a passive state (e.g., no heating) by controlling the current flow to the load elements 208. The switch elements 210, 210a, 210b, 210c may prevent or enable current flow to or from the load elements 208, 208a, 208b, 208c. The switch element 210 may be a bi-directional current component that allows current flow through the switch element 210 after a threshold voltage is exceeded. For example, the bi-directional component may be arranged to allow current to flow through them when a voltage threshold is exceeded. In one specific embodiment, the bi-directional component may be a thyristor that may include four layers that alternate between different dopant conditions (e.g., n-type or p-type) that may operate as a bistable switch that transitions to a conductive state when a voltage threshold is exceeded. For example, if the voltage threshold was 5V and the signal generator provides an electrical signal that is less than 5V, the switch element 210 may not allow current to flow through to the load element 208. However, when the electrical signal applied to the common terminal 204 exceeds 5V, the switch element 210 may allow current to flow through to the load element 208 that may generate heat that may be transferred to the substrate holder 124 and/or the substrate 110. Accordingly, the current flow to the load elements 208, 208a, 208b, 208c may be controlled based, at least in part, on the threshold voltages of their corresponding switch elements 210, 210a, 210b, 210c and the type of signal provided by the signal generator 142. Several different embodiments of heating module 202 arrangements, load element 208 types and switch element 210 types may be used to generate different temperature profiles at the substrate 110.

In one embodiment, the heating modules 202 may be evenly distributed across the substrate holder 124. The load elements may have the same or similar resistance values and the threshold voltages for the switch elements 210 may be the same or similar for all the heating modules 202. In this instance, the heating modules 202 may generate the same or similar amount of heat when the electrical signal from the signal generator 142 may be applied to the heating array 132. In this embodiment, the switch elements 210, 210a, 210b, 210c may transition to an active state at the same time and allow the same or similar amount of current to be applied to the load elements 208, 208a, 208b, 208c. The heating modules 202 may generate the same amount of heat to the substrate holder 124.

However, in some embodiments, the temperature profile across the substrate 110 may not be uniform due to heat loss and/or gain inherent in the process chamber 102 and the plasma process. For example, the center of the substrate holder 124 may more easily retain heat than the perimeter of the substrate holder 124. The higher heat loss at the edge may be driven due to geometrical peculiarities of the substrate holder, its edge area may be more effectively cooled by process cooling water, etc. In this instance, the edge of the substrate holder 124 may have a higher heat loss and may make the edge of the substrate holder 124 cooler than the center of the substrate holder 124, in this specific embodiment.

In other embodiments, the heating array 132 may include any number of heating modules 202 that may be disposed within or adjacent to the substrate holder 124. The heating modules 202 may be distributed across the substrate holder 124, such that each heating module 202 may be responsible for heating specific zones underneath the substrate 110. The heating zones may or may not overlap each other, depending upon the temperature profile needed for a specific process. The heating zones may also overlap depending on the characteristics of the heating modules 202, 202a, 202b, 202c, such that the response times, settling times, and overshoot control of the heating modules may vary from process to process. The heating module 202 may include a switch element 210 and a load element 208 that may be connected in series with each other. The heating modules 202a, 202b, 202c may be arranged in parallel to each other, such that each heating module 202, 202a, 202b, 202c may receive the same electrical signal from the signal generator. However, the switch elements 210, 210a, 210b, 210c may have different threshold voltages, such that a portion the switch elements (e.g., 210, 210a) may flow current to their respective load elements (e.g., 208, 208a) while the remaining switch elements (e.g., 210b, 210c) may not flow current to their respective load elements (e.g., 208b, 208c). In this way, the heating modules 202, 202a, 202b, 202c may be used to selectively heat portions of the substrate holder 124 at different times and/or at different intensities.

The heating modules 202, 202a, 202b, 202c, $202n^{th}$ may be arranged by groups throughout the substrate holder 124 to cover zones or regions of the substrate 110. For example, the center region of the substrate 202 by a first group (not shown) of heating modules 202 and edge region of the substrate 110 may be covered by a second group (not shown) of heating modules 202. In this way, the heating modules 202 may be able to generate heat in a selective manner across or around the substrate holder 124. The selective heating may be depend upon the location of the heating modules 202 and how they may be arranged with respect to each other and their relative heating performance. The heating performance or temperature profile across the substrate 110 may be based, at least in part, on the resistance of the load elements 208, the threshold voltages of the switch elements 210, and the voltage and/or duty cycle of electrical signal applied to the heating modules 202.

In one embodiment, the heating modules 202 of the first group and the second group may be co-located with at least one heating module 202 from the other group. The two heating modules 202 that are proximate to each other may have different threshold voltages for their switch elements 210 and they may have different resistances for their load elements 208. In this instance, the paired heating modules 202 may cover the same or similar zone, but may heat the zone differently based, at least in part, on different load elements 208 and the magnitude of the current provided to the load elements 208. In this way, the heating modules 202 may be designed to generate heat in a different manner based on how the different load elements 208 react to the signal applied by the signal generator 142. These factors may result in different temperature magnitudes, ramp times, settling times, or temperature overshoot. Another aspect of the heating array 132 may be the use of a single signal generator 142 to power all of the load elements 208 through the common terminal 204. Using a single signal generator 142 may reduce the cost of the plasma processing system 100 and reduce the cost of maintenance.

Figure 3:
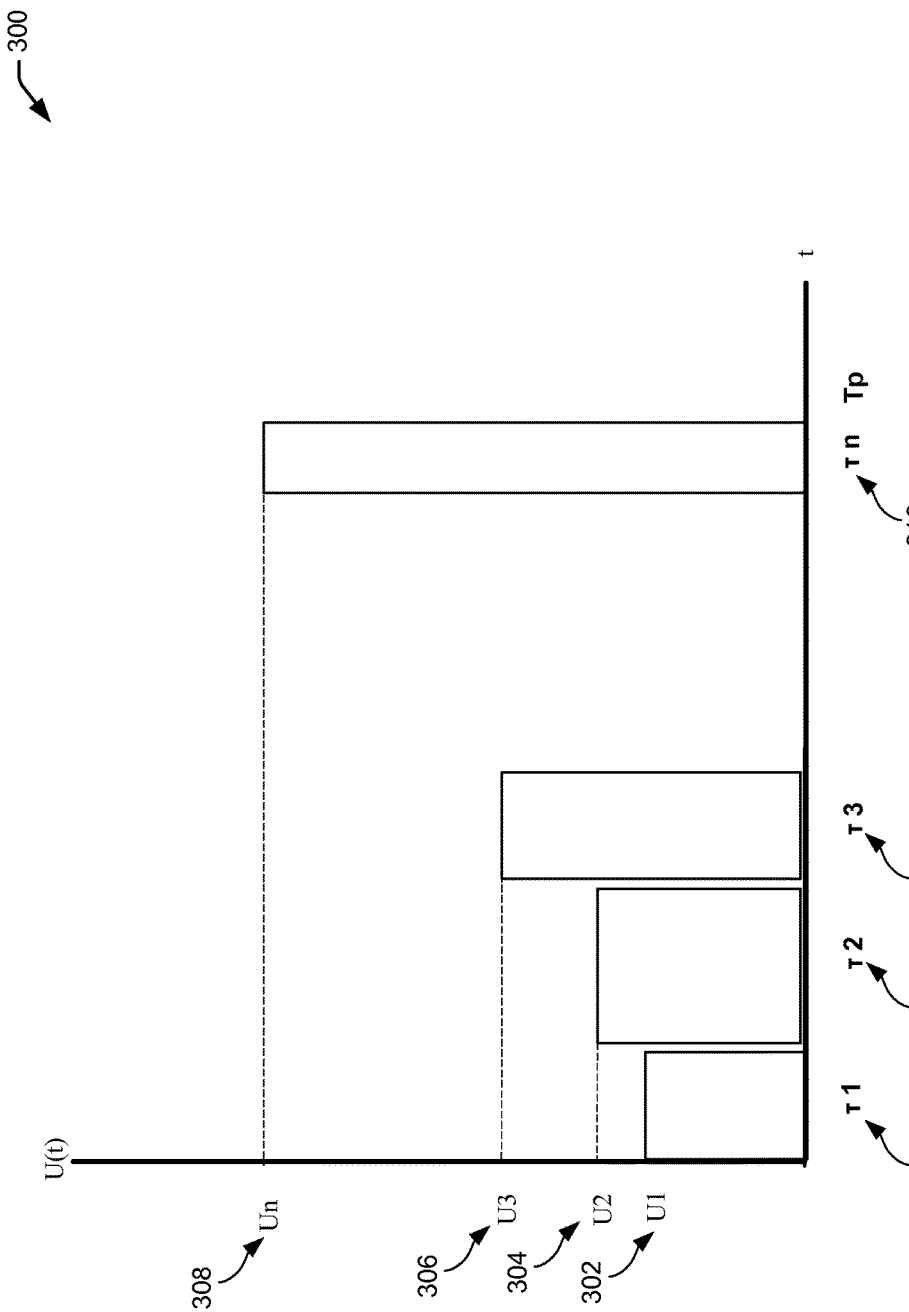
FIG. 3 is an illustration of a representative embodiment of power modulation signal that may be applied to the heating array according to at least one embodiment.

FIG. 3 is an illustration of one embodiment an electrical signal 300 or power modulation signal that may be generated by the signal generator 142 and applied to the heating array 132. The electrical signal 300 may be designed to generate a uniform temperature profile across the substrate chuck 124. However, the temperature profile may not be required to be uniform and the electrical signal 300 may be designed generate to higher or lower temperatures at selected portions of the heating array 132. As noted above, the different heat transfer characteristics of the plasma chamber 102 may cause temperature changes across the substrate 110 that may warrant a less uniform or non-uniform temperature profile across the substrate chuck 124 using the heating array 132. For example, in one specific instance, ion and electric currents from the plasma may increase the temperature at a higher rate or value at the center of the substrate chuck 124. Hence, it may be desirable to limit the amount of heat generated by the heating array 132 at the center of the substrate chuck 124. This may be accomplished by designing an electrical signal 300 that accounts for the threshold voltages and resistances of the heating modules 202 to reduce the amount of heat generated by the heating modules 202 proximate to the center of the substrate 124. However, the temperature profile across the substrate chuck 124 may also be impacted by conditions other than plasma. Likewise, the electrical signal 300 may be designed to apply more energy to other heating modules 202 that may have a lower temperature than the center of the substrate 124. For example, the edge or perimeter of the substrate chuck 124 may have higher heat loss that may impact the uniformity of the plasma treatment across the substrate 110. Accordingly, the electrical signal 300 may be designed to apply more energy to the heating modules 202 at the edge of the substrate chuck 124 to increase process uniformity across the substrate 110. A person of ordinary skill in the art may be able to program the controller 134 to enable the signal generator 142 to selectively target heating modules 202 to achieve desired plasma process results.

The signal generator 142 may be any device that may generate a repeating or non-repeating electronic signal (analog or digital) that may vary in voltage and duty cycle (e.g., pulse duration and period). The electrical signal 300 may be designed to selectively exceed the threshold voltages for selected switch elements 210 for discrete periods of time to allow current to flow to their respective load element 208, which generate heat. The amount of heat generated by the load element may depend upon, but is not limited to, load element 208 resistance, switch element 210 threshold voltage, and the duty cycle.

The duty cycle may be a ratio of the duration of time a threshold voltage may be applied and the period of the electrical signal 300 that oscillates between the "on" and "off" state the heating module 202. The duty cycle may be varied to apply voltage to different heating modules 202 for different periods of time. In this way, a person of ordinary skill in the art may adjust the temperature profile by applying different voltages for different periods of time to select heating modules 202. In this way, differences in heat retention or flux throughout the substrate holder 124 or plasma chamber 102 may be compensated for by the heating array 132 to generate a desired temperature profile during the plasma treatment.

Turing to FIG. 3, one embodiment of the electrical signal 300 may be represented by a Voltage (U(t)) vs time (τ) graph that illustrates when and how much voltage may be applied to the heating array 132. The signal generator 142 may vary the voltage between two or more threshold voltages (e.g., first voltage 302, second voltage 304, third voltage 306, . . . n voltage 308) for discrete periods of time (e.g., first time 310, second time 312, third time 314, . . . n time 316). For example, the first voltage 302 may be the threshold voltage for first switch element 210a, the second voltage 304 may be the threshold voltage for the second switch element 210b, and the third voltage 306 may be the threshold voltage for the third switch element 210c. In this instance, the voltages may be cumulative, in that when the second voltage 304 is applied to the heating array 132, the first load element 208a and the second load element 208b may generate power. However, the second load element 208b may generate power during the second time 312 period, but the first load element 208a may generate power during the first time 310 period and the second time 312 period. Likewise, during the third time 314 period, all three load elements 208a, 208b, 208 may generate power (e.g., heat) during that time. In one embodiment, the electrical signal 300 may repeat through the same conditions again or the electrical signal 300 may be modified to power the heat modules 202 in a different way. Accordingly, a person of ordinary skill in the art may modify the electrical signal 300 to generate power or heat at particular locations across the heating array 132 by varying the threshold voltage and duty cycle of the electrical signal 300. Table 1 illustrates several embodiments of electrical signal 300 variation.

TABLE 1

| Settings | | A: T1 < T2 < T3 | | B: T1 < T3 < T2 | | C: T3 < T2 < T1 | |
|---|---|---|---|---|---|---|---|
| R1 | 400 Ohm | U1 | 85 V | U1 | 80 V | U1 | 88 V |
| R2 | 80 Ohm | U2 | 100 V | U2 | 100 V | U2 | 115 V |
| R3 | 22 Ohm | U3 | 210 V | U3 | 210 V | U3 | 210 V |
| Uth1 | 5 V | Duty1 | 0.7 | Duty1 | 0.75 | Duty1 | 0.85 |
| Uth2 | 90 V | Duty2 | 0.1 | Duty2 | 0.12 | Duty2 | 0.08 |
| Uth3 | 200 V | Duty3 | 0.01 | Duty3 | 0.009 | Duty3 | 0.008 |
| | | P1 | 16 W | P1 | 16 W | P1 | 20 W |
| | | P2 | 18 W | P2 | 20 W | P2 | 18 W |
| | | P3 | 20 W | P3 | 18 W | P3 | 16 W |
| Settings | | D: T2 < T3 < T1 | | E: T1 << T2 << T3 | | F: T3 << T2 << T1 | |
| R1 | 400 Ohm | U1 | 88 V | U1 | 85 V | U1 | 88 V |
| R2 | 80 Ohm | U2 | 110 V | U2 | 100 V | U2 | 110 V |
| R3 | 22 Ohm | U3 | 210 V | U3 | 210 V | U3 | 210 V |
| Uth1 | 5 V | Duty1 | 0.85 | Duty1 | 0.1 | Duty1 | 0.91 |
| Uth2 | 90 V | Duty2 | 0.07 | Duty2 | 0.05 | Duty2 | 0.07 |
| Uth3 | 200 V | Duty3 | 0.01 | Duty3 | 0.01 | Duty3 | 0.002 |
| | | P1 | 20 W | P1 | 4 W | P1 | 20 W |
| | | P2 | 16 W | P2 | 12 W | P2 | 12 W |
| | | P3 | 18 W | P3 | 20 W | P3 | 4 W |

Table 1 illustrates six embodiments of how the electrical signal 300 may be varied to provide power to different heating modules 202 in the same heating array 132. As shown under the settings column, the load elements 208 resistance and switch elements 210 threshold voltages are presumed not to vary. In this instance, the load elements 208a, 208b, 208c may have a resistance varying from 400Ω down to 22Ω and the switch elements 210a, 210b, 210c may have threshold voltages varying from 5V to 200V. However, in other embodiments, the resistances and threshold voltages are not required to be fixed values. But, the fixed settings may be able to produce different temperature profiles by varying the voltage and the duty cycle of the electrical signal 300. This may be preferable to switching out components from the heating array 132. Columns A-F of Table 1 provide representative embodiments of how a single heating array 132 may be used to obtain different temperatures at different locations using the same load elements 208.

Column A, of Table 1, illustrates a desired temperature profile (e.g., T1<T2<T3) where the temperature at first load element 208a is less than the temperature of the second load element 208b and the third load element 208c and the temperature of the third load element 208c is greater than the temperature of the second load element 208b. In this embodiment, the first voltage 302 may be about 85V for a duty cycle of 0.7, which means that the first voltage 302 may be applied for about 70% of the period of the electrical signal 300. Next, the electrical signal 300 may increase to 100V with a duty cycle of about 0.1. In this instance, the first load element 208a and the second load 208b may generate power during this portion or time period. Lastly, the electrical signal 300 may transition to 210V for a duty cycle of 0.01. The electrical signal 300 of column A may repeat as needed to achieve the desired temperature profile across the substrate chuck 124. In this embodiment, the first load element 208a may generate 16 W or a lower temperature than the second load element 208b (e.g., 18 W) and the third load element 208c (e.g., 20 W). The power may be determined using equation (1) described below in the description of FIG. 6.

The column B embodiment illustrates another desired temperature profile (e.g., T1<T3<T2) using the same heating array 132 that may be used to implement the column A embodiment. In this instance, the voltages may be similar to the column A embodiment, but the duty cycle of the column B embodiment varies slightly from the column A embodiment. For example, the first voltage 302 may be about 85V for a duty cycle of 0.75, which means that the first voltage 302 may be applied for about 75% of the period of the electrical signal 300. Next, the electrical signal 300 may increase to 100V with a duty cycle of about 0.12. In this instance, the first load element 208a and the second load 208b may generate power during this portion. Lastly, the electrical signal 300 may transition to 210V for a duty cycle of 0.009. In this embodiment, the first load element 208a may generate 16 W or a lower temperature than the second load element 208b (e.g., 18 W) and the third load element 208c (e.g., 20 W), but the second load element 208b (20 W) generates a higher temperature than the third load element 208c (e.g., 18 W). As noted above, the power may be determined using equation (1) described below in the description of FIG. 6.

The column C embodiments illustrates another desired temperature profile (e.g., T3<T2<T1) using the same heating array 132 described in the column A embodiment. For example, the first voltage 302 may be about 88V for a duty cycle of 0.85, which means that the first voltage 302 may be applied for about 85% of the period of the electrical signal 300. Next, the electrical signal 300 may increase to 115V with a duty cycle of about 0.08. In this instance, the first load element 208a and the second load 208b may generate power during this portion. Lastly, the electrical signal 300 may transition to 210V for a duty cycle of 0.008. In this embodiment, the first load element 208a may generate 16 W or a lower temperature than the second load element 208b (e.g., 18 W) and the third load element 208c (e.g., 20 W), but the second load element 208b (20 W) generates a higher temperature than the third load element 208c (e.g., 18 W). As noted above, the power may be determined using equation (1) described below in the description of FIG. 6.

The embodiments illustrated in columns D, E, F provide additional examples of how the temperature profile across the substrate may be varied by making changes to the electrical signal 300, particularly the voltage magnitude and the duty cycle.

Figure 4:
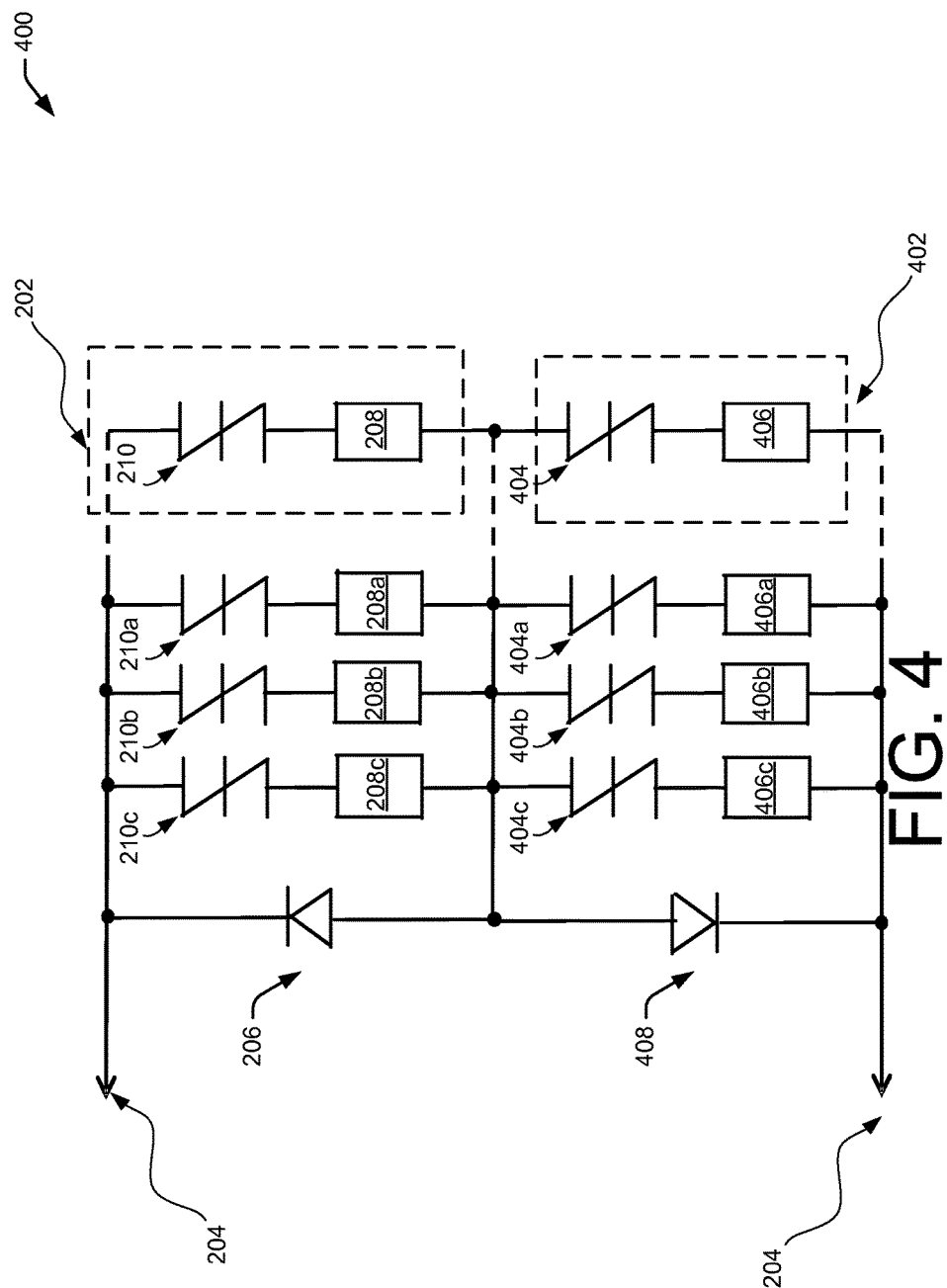
FIG. 4 is an illustration of another circuit diagram of the heating array according to at least one embodiment.

FIG. 4 is an illustration of another circuit diagram 400 of the heating array 132 that increases (e.g., may double) the amount of heating modules 202 from the FIG. 2 embodiment. In this instance, another row of heating modules 402 may be placed in series with the heating modules 202 from FIG. 2. The heating modules 402 may contain a switch element 404 connected in series with a load element 406 and may be in parallel with another signal regulation component 206, 408 (e.g., diode). Again, the electrical signal 300 may be applied across the common terminals 204, such that each of the electrical signal 300 may be applied to each group of heating modules (e.g., 202, 402). In the FIG. 4 embodiment, the circuit diagram 400 includes eight heating modules 202, 202a, 202b, 202c, 402, 402a, 402b, 402c, but other embodiments may not be limited to eight and may include many more heating modules (e.g., 202, 402) than shown in FIG. 4.

Increasing the amount of heating modules 202, 402 in the heating array 132 may enable a higher degree of temperature control resolution. For example, if the surface area of the substrate chuck 124 surface area in the FIG. 2 embodiment is also used with the FIG. 4 heating array 132, the higher density of the heat sources may increase the temperature control resolution. The higher heat source density may increase the ability to adjust or to obtain a desired temperature profile due when each heat source may be used to control temperature over a smaller surface area. Having a higher density of heat sources make allow a person of ordinary skill in the art to control the temperature profile to a tighter tolerance or reduce temperature variation across the substrate chuck 124. The higher heat source density may also reduce temperature variation by placing the heat source closer to each other so that they may collaborate to manage transient temperature conditions, particularly temperature transient conditions in high thermal flux regions (e.g., substrate chuck perimeter) where temperature variation may be harder to stabilize or control.

Although adding heat modules 402 may increase temperature control, the heating array 132 may still receive the same or similar electrical signal from one or more signal generators (not shown). However, in one specific embodiment, the FIG. 4 heating array 132 may still be powered by a single generator 142 using a bi-polar power signal to accommodate the additional heating modules 402.

Figure 5:
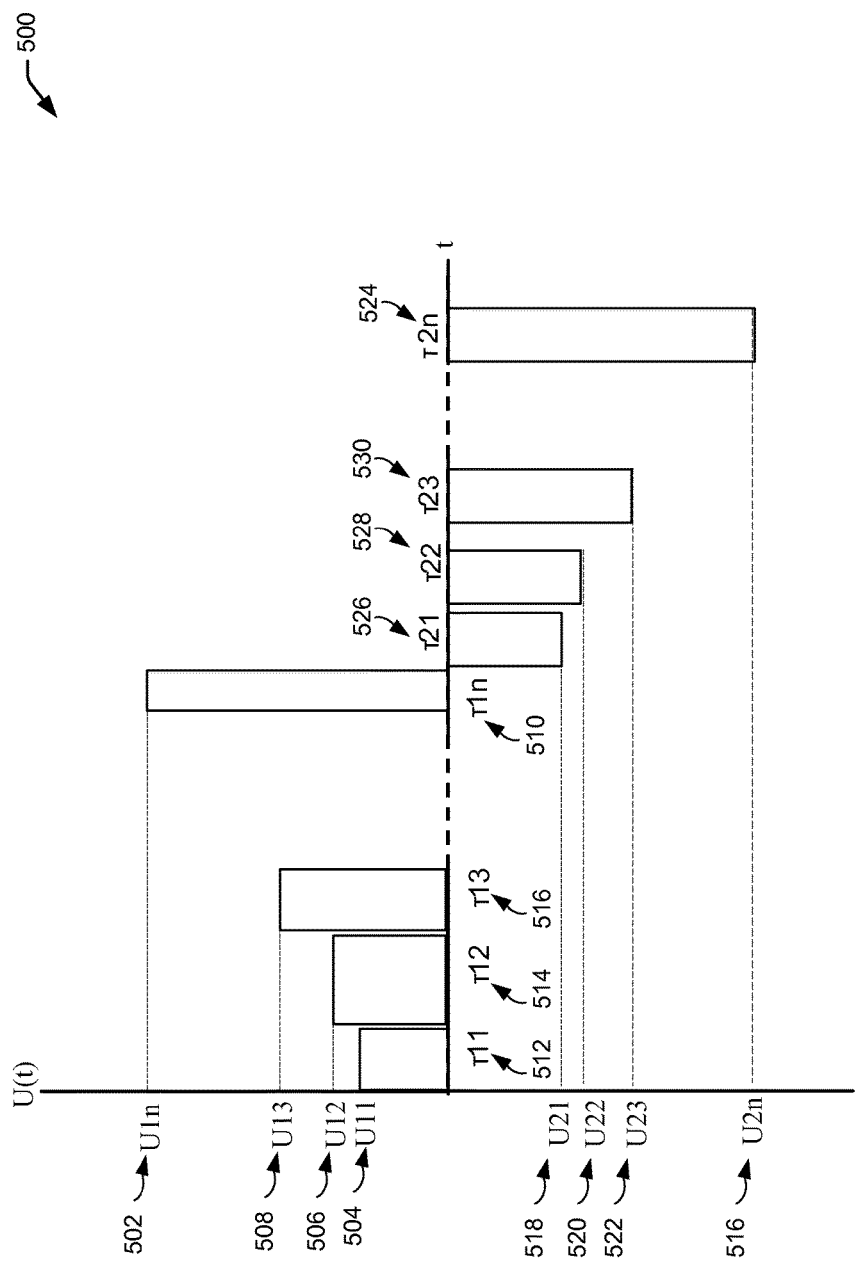
FIG. 5 is an illustration of another representative embodiment of the power modulation signal that may be applied to the heating array according to at least one embodiment.

FIG. 5 includes an illustration of a graphic-representation of a bi-polar electrical signal 500 or power modulation signal that may be applied to the FIG. 4 heating array 132 to generate desirable temperature profiles across the substrate chuck 124. FIG. 5 merely illustrates one embodiment of the bi-polar electrical signal 500. In other embodiments, a person of ordinary skill in the art may be able to design other bi-polar electrical signals (not shown), similar to the Table 1 embodiments, to achieve a variety of different temperature profiles across the substrate chuck 124.

The bi-polar electrical signal 500 may turn on or off individual or groups of heating modules 202, 402 by using positive or negative voltage values that are applied for discrete periods of time. The individual heating modules (e.g., 202, 402) or groups of heating modules (e.g., 202a, 202b, 202c) may have different breakover voltages from the remaining heating modules (e.g., 402a, 402b, 402c). Likewise, the remaining heating modules (e.g., 402a, 402b, 402c) may also have different breakover voltages from each other, as shown in FIG. 5. However, they are not required to have different breakover voltages.

As shown in FIG. 5, the bi-polar electrical signal 500 may have voltage variations as a function of time (e.g., U(t)) that may alternate between a positive voltage regime and a negative voltage regime. In contrast to FIG. 3 embodiment, the FIG. 5 embodiment utilizes the negative voltage regime to enable the ability to selectively target additional heating sources without having to increase the number of heating sources 202, 402 that will be active at the same time. For example, in Table 1 column A the using a negative voltage regime may allow additional heat modules 402 to be active (e.g., applied negative voltage) while the positive voltage regime heat modules 202 (in column A) may be turned off. Hence, the bi-polar electrical signal 500 may increase the selectivity of how many heat modules 202, 402 may be turned on or off. Using the positive and negative voltage regime, in combination with the duty cycle and different threshold voltages for the switch elements 210, 404, may increase the amount of heating modules 202, 402 (as shown in FIG. 4) that may be individually controlled using the one power signal generator 142. Accordingly, the FIG. 4 heat array 132 embodiment may have a higher temperature resolution than the FIG. 2 embodiment.

In the FIG. 5 embodiment, the bi-polar electrical signal 500 may alternate between positive voltages $U1n$ 502 (e.g., $U11$ 504, $U12$ 506, $U13$ 508) for discrete periods of time $\tau 1n$ 510 (e.g., $\tau 11$ 510, $\tau 12$ 512, $\tau 13$ 514) and negative voltages $U2n$ 516 (e.g., $U21$ 518, $U22$ 520, $U23$ 522) for discrete periods $\tau 2n$ 524 (e.g., $\tau 21$ 526, $\tau 22$ 528, $\tau 23$ 530) of time that may vary depending upon the desired duty cycle or temperature profile across the substrate 110. The FIG. 5 embodiment is provided merely for illustrative purposes and the scope of the disclosure is not intended to be limited to this embodiment. A person of ordinary skill in the art may vary the voltage and duty cycle to enable a plurality of temperature profiles as described in the Table 1 embodiments. For example, in one embodiment, the first array of heating modules 202 may be arranged around the edge of the substrate chuck 124 and the second array of heating modules 402 may be arranged closer to the center of the substrate chuck 124. In this instance, a person of ordinary skill in the art may vary the duty cycle to apply more power to one or more of the first array of heating modules 202 because the edge of the substrate chuck 124 may have a higher heat flux than the center of the substrate chuck 124. The higher heat flux, in one instance, may be due to the edge of the substrate being closer to the cooler process chamber 102 wall. Hence, the temperature profile may vary across the substrate 110 and the duty cycle and voltage of the bi-polar electrical signal 500 may be varied to minimize temperature uniformity across the substrate 110.

However, in other embodiments, a person of ordinary skill in the art may use the heating array 132 to induce temperature non-uniformity across the substrate 110. The temperature non-uniformity may be used to increase reaction rates (e.g., deposition or etch) at different positions of the substrate 110. In one embodiment, the localized temperature variation may be used to account for variations in the substrate 110 that may include, but are not limited to, thickness variations or feature size variations across the substrate 110. For example, the substrate 110 may include have a higher film thickness at the edge of the substrate 110 that at the center of the substrate 110. Hence, having the same etch rate at the center of the substrate 110 may not remove enough of the film at the edge of the substrate. Incomplete removal of the film across the substrate 110 may be detrimental to the quality or yield of the devices being manufactured on the substrate 110. A person of ordinary skill in the art may vary the duty cycle and voltage to selectively apply power to each of the heating modules 202, 402 by using the bi-polar electrical signal 500 may increase the amount of heating modules 202, 402 that may be used to generate temperature profiles across the substrate 110. The variation of the bi-polar electrical signal 500 may be similar to the embodiments of Table 1, except for the increase in the number of resistive elements and the negative voltage set points that may enable a higher degree of control over the individual heating modules 202, 402.

In one bi-polar electrical signal 500 embodiment, the signal regulation components 206, 408 direct the current towards first array of heating modules 202 or second array of heating modules 402, depending on the configuration of the signal regulation components 206, 408. In the FIG. 4 embodiment, the signal regulation components 408 may be a diode that has a breakover voltage that may be greater than the voltage provided by the power signal generator 142. When a positive voltage is applied to the circuit diagram 400, the current flows through the second signal regulation component 408 which directs the current towards the first array of heating modules 202. Due to a small voltage drop across diode 408, there is minimum or zero current flowing through the second array of heating modules 402. when a negative voltage is applied to the circuit 400, the signal regulation components 206, 408 may direct the current to the second set of heating modules 402 and may not subject the first set of heating modules 202 to the applied voltage from the power signal generator 142. The switch elements 404 may be configured to selectively apply the bi-polar electrical signal 500 based, at least in part, on the difference in breakover voltages of the switch elements 404. Hence, the heating modules 404 may selectively heat the substrate chuck in a similar manner as shown in Table 1, but with a combination of positive and negative voltages and different duty cycles to account for the additional elements not shown in Table 1. In this way, a person of ordinary skill in the art may selectively generate heat across the substrate 110 by selectively applying power to the load elements 208, 406 based, at least in part, on the combination of the duty cycle, signal voltage, and the breakover voltages of the switching elements 210, 404.

Figure 6:
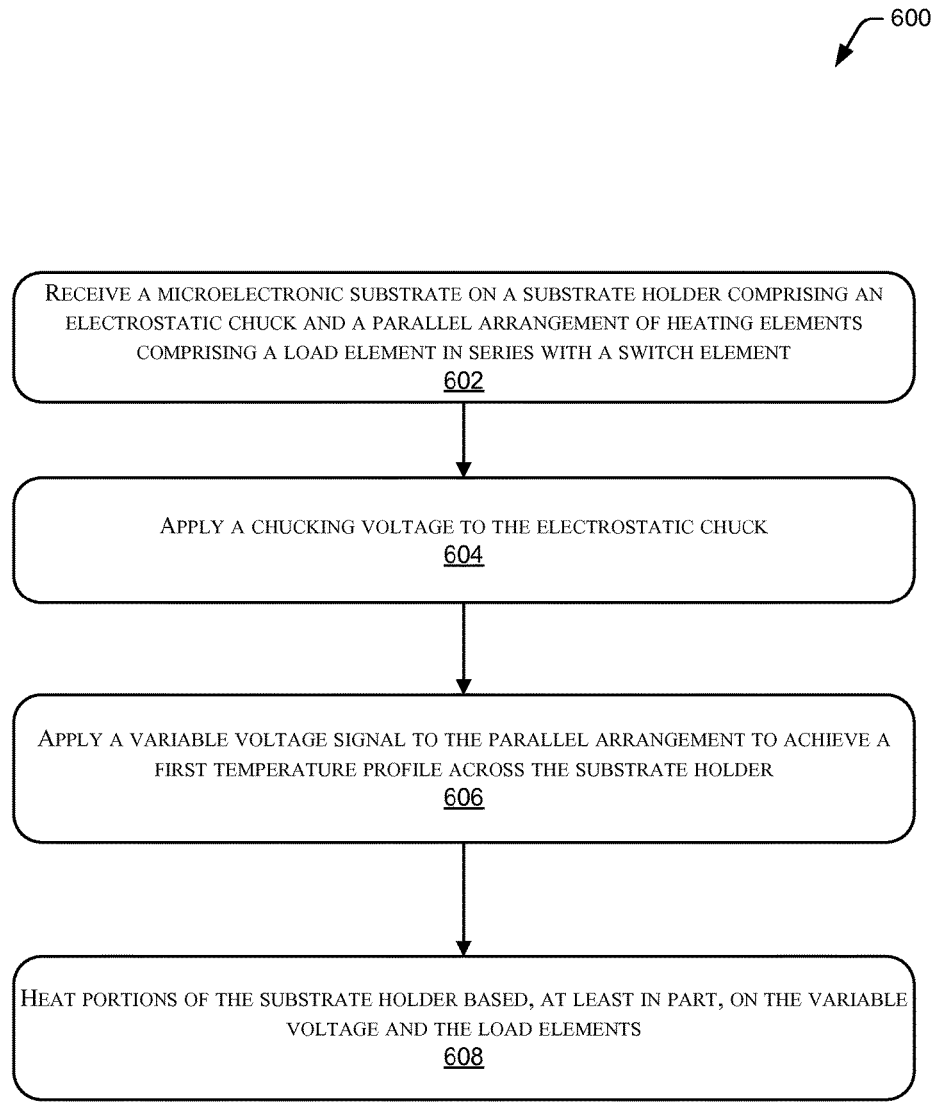
FIG. 6 is a flow diagram for method for generating temperature profiles for a microelectronic substrate using the heating array according to at least one embodiment.

FIG. 6 is a flow diagram 600 for a method for generating temperature profiles across the microelectronic substrate 110 using the heating array 132 during a plasma processing treatment. The method of FIG. 6 illustrates one embodiment for using the heating array 132 and other steps may be added or omitted to achieve a desired result as determined by a person of ordinary skill in the art of plasma processing. In one embodiment, the heating array 132 may include heating modules 202 distributed across the substrate chuck 124. The heating array 132 may include a combination of a switching elements 210 and load elements 208. The switching elements 210 may designed to pass current to its respective load element 208 at specific voltages, as shown in Table 1. The load elements 208 may generate heat depending upon the amount of current that may be received from the power signal generator 142 and the load element 208 resistance, as shown in Table 1. The duty cycle and power signal voltage may be varied as shown in FIGS. 3 and 5 to selectively generate heat using the heating modules 202, 402 for discrete periods of time.

Turning now to FIG. 6, at block 602, the plasma treatment process may begin when a microelectronic substrate 110 may be placed on a substrate holder (e.g., substrate cuck 124) that may include an electrostatic chuck or component that may be used to secure the substrate 110 in the plasma chamber 102. The electrostatic chuck may or may not be separate from the heating array 132 that may include a parallel arrangement of heating elements (heating modules 202) that may be used to generate heat at localized portions of the substrate 110 or be used in combination to generate a temperature profile across the substrate 110.

At block 604, the electrostatic chuck may generate an electrostatic potential subjacent to the substrate 110 that may be used to clamp or secure the substrate 110 to prevent movement during the plasma treatment. The electrostatic chuck may receive a chucking voltage from chucking power source that may be operated independently of the power signal generator 142. However, the chucking voltage may be applied to the substrate chuck 124 when the heating array 132 may be receiving a signal from the power signal generator 142. Following the application of the chucking voltage, the plasma process treatment may begin or the plasma process treatment may begin after a desired temperature profile may be established across the substrate 110 prior to the plasma treatment. In another embodiment, the electrostatic chucking may be not be used. Hence, block 604 may be omitted from the FIG. 6 method in this instance.

At block 606, the temperature profile may be generated by applying a variable voltage signal to the parallel arrangement (e.g., heating array 132) to achieve a first temperature profile across the substrate chuck 124. The variable voltage signal may be similar to the signals illustrated in FIGS. 3 & 5 or described in Table 1. In the FIG. 3 embodiment, the variable voltage signal may vary between different positive voltage set points for discrete periods of time. The varying voltage may be used to select which heating module 202 that may be used to generate heat at different locations across the substrate 110. The duty cycle may determine how long the varying voltage may be held constant to enable an individual heating module(s) 202 to generate heat. At the end of the time period, the voltage may change to a different voltage set point, such that a different or another heating module 202 may be exposed to the voltage. As noted above in the descriptions of FIGS. 2-5, the voltage exposure may be dependent upon the threshold voltage of the switching element 210 of the targeted heating module 202. If the voltage exposure is greater than the threshold voltage the voltage may be applied to the load element 208 to generate heat for that discrete period. Again, at the end of that time period, the voltage may change to another voltage set point for another period of time and use a different heating module 202 to generate heat for another discrete period of time.

In another embodiment, the variable voltage signal may be the bi-polar electrical signal 500 that may incorporate a positive voltage component and a negative voltage component. As noted in the description of FIG. 5, the bi-polar electrical signal 500 vary between positive negative voltages to selectively target a specific switch elements 404 or group of switch elements 404a, 404b. Again the bi-polar electrical signal 500, may be applied for discrete periods of time to target specific heating modules 402.

At block 608, portions of the substrate holder (e.g., substrate chuck 124) may be selectively heated based, at least in part, on the variable voltage, duty cycle and the load elements. More particularly, the heating array 132 within the substrate holder may generate a temperature profile across the substrate 110. The heating array 132 may selectively heat portions of the substrate 110 by arranging heating modules 202 at different positions within the substrate holder. The heating module 202 may include the switch elements (e.g., switch elements 210, 210a, etc.) that may prevent or allow current to reach their respective resistors (e.g., load elements 208, 208a, etc.) that generate the heat.

As noted in the description of FIGS. 2-5, the variable voltage signal may include a voltage signal that may vary with time to selectively target specific heating modules 202 or groups of heating modules 202, 202a to generate heat for discrete periods of time or a desired duty cycle. For example, Table 1 illustrates one embodiment of a heating array 132 that includes three heating modules 202 that includes three load elements 208 (e.g., R1, R2, R3) and their corresponding switch elements 210 (e.g., Uth1, Uth2, Uth3). The load elements 208 may receive current when the variable voltage signal exceeds the threshold values for Uth1, Uth2, Uth3, such that R1 may receive current when the variable voltage signal has a voltage greater than 5V, and R1 and R2 may receive current when the variable voltage signal has a voltage greater than 90V, and that R1, R2, and R3 may receive current when the variable voltage signal has a voltage greater than 200V.

However, the amount of time the load elements 208 may be exposed to current may also depend upon the duty cycle of the variable voltage signal. As shown in Table 1, R1 may be exposed to current for about 70% of the time, R2 may be exposed to current for about 1% of the time, and R3 may be exposed to current for about 0.1% of the signal period. A person of ordinary skill in the art may arrange the duty cycle, such that the amount of time that R1, R2, and R3 are exposed to the current may not exceed 100%. In this embodiment, R1 may generate approximately 16 W of power, R2 may generate approximately 18 W of power, and R3 may generate approximately 20 W of power. The power may be determined by using equation (1):

$$P_n = [U_1^2 D_1 + U_2^2 D_2 + \ldots U_n^2 D_n]/R_n \quad (1)$$

In other embodiments, a person of ordinary skill in the art may also select the amount of heating modules 202 and their arrangement across the substrate holder 124 to achieve a desired temperature profile. Further, the variable voltage signal may be designed to assist in maintaining the temperature profile across the substrate 110. In this way, the heating array 132 may achieve different temperature profiles using the same heating modules 202 in the substrate holder. A person of ordinary skill in the art may vary the duty cycle to generate different heating conditions due to the variance in power, as shown in Table 1, where the power generated by each of the load elements 208 (e.g., R1, R2, R3) may vary in power between 4 W and 20 W based, at least in part, on the duty cycle. Hence, a person of ordinary skill in the art would configure the duty cycle to achieve the desired power levels at load elements 208 (e.g., R1, R2, R3) or the desired temperature profile across the substrate 110.

It is to be appreciated that the Detailed Description section, and not the Abstract section, is intended to be used to interpret the claims. The Abstract section can set forth one or more, but not all exemplary embodiments, of the present disclosure, and thus, is not intended to limit the present disclosure and the appended claims in any way.

While the present disclosure has been illustrated by the description of one or more embodiments thereof, and while the embodiments have been described in considerable detail, they are not intended to restrict or in any way limit the scope of the appended claims to such detail. Additional advantages and modifications will readily appear to those skilled in art. The invention in its broader aspects is therefore not limited to the specific details, representative apparatus and method and illustrative examples shown and described. Accordingly, departures may be made from such details without departing from the scope of the general inventive concept.

What is claimed is:

1. An apparatus, comprising:
   a signal generator that generates a power modulation signal;
   a heating array coupled to the signal generator, the heating array comprising heating modules that are arranged in parallel, the heating modules comprising a load element and a switch element that are in electrical communication with the signal generator, the load element being in series with the switch element;
   a substrate chuck adjacent to the heating array, the substrate chuck comprising a supporting surface for a microelectronic substrate; and
   an electrostatic chuck component that can generate an electromagnetic field, the electrostatic chuck component being subjacent to the substrate chuck.

2. The apparatus of claim 1, wherein at least two of the load elements comprise different resistance values and the switching elements comprise different breakover voltages.

3. The apparatus of claim 1, wherein the switching elements comprise thyristor devices or bi-directional diodes.

4. The apparatus of claim 1, wherein the signal generator comprises a voltage component that varies voltage and duty cycle.

5. The apparatus of claim 4, wherein a first group of heating modules comprises breakover voltages within a first range; and a second group of heating modules comprising breakover voltages within a second range that is different from the first range.

6. The apparatus of claim 1, wherein the heating array comprises a first group of heating modules comprising breakover voltages within a first range; and a second group of heating modules comprising breakover voltages within a second range that is different from the first range.

7. An apparatus, comprising:
   a substrate support surface that can support a microelectronic substrate;
   a heating array subjacent to the substrate support surface, the heating array comprising a first parallel arrangement of heating elements, the heating elements comprising a load element connected in series with a bi-directional current component; and
   an electrostatic chuck component subjacent to the substrate support surface.

8. The apparatus of claim 7, wherein the heating array comprises a second parallel arrangement of heating elements that are in series with the first parallel arrangement of heating elements that is in parallel with at least one diode.

9. The apparatus of claim 7, wherein the bi-directional current components comprise different breakover voltages.

10. The apparatus of claim 9, wherein the load elements comprise different resistance values.

11. The apparatus of claim 9, wherein the load elements comprise a common resistance value.

12. The apparatus of claim 9, wherein the load elements comprise two or more groups of the load elements that have different resistance values.

13. The apparatus of claim 7, wherein the heating elements comprises two or more groups of the bi-directional current components that have different breakover voltages.

14. The apparatus of claim 7, wherein the bi-directional current components comprise an electrical element that conducts current flow when a first voltage is applied and prevents current flow through the electrical element when a second voltage is applied.

15. The apparatus of claim 7, further comprising a single power source coupled to the heating array.

16. A method for treating a substrate, comprising:
receiving a microelectronic substrate on a substrate holder comprising an electrostatic chuck and a parallel arrangement of heating elements comprising a load element in series with a switch element;
applying a chucking voltage to the electrostatic chuck; applying a variable voltage signal to the parallel arrangement to achieve a first temperature profile across the substrate holder; and heating portions of the substrate holder based, at least in part, on the variable voltage and the load elements.

17. The method of claim 16, wherein the variable voltage signal comprises a bi-polar component.

18. The method of claim 16, wherein the heating further comprises changing the variable voltage signal to obtain a second temperature profile across the substrate holder.

19. The method of claim 16, wherein the heating is further based, at least in part, on breakover voltages of the load elements.

20. The method of claim 16, wherein the heating is further based, at least in part, on a duty cycle of the variable voltage.

* * * * *